United States Patent [19]

Masquelier et al.

[11] Patent Number: 5,130,262
[45] Date of Patent: Jul. 14, 1992

[54] INTERNAL CURRENT LIMIT AND OVERVOLTAGE PROTECTION METHOD

[76] Inventors: Michael P. Masquelier, 1035 W. Portobello, Mesa, Ariz. 85210; David N. Okada, 67 E. Calle De Arcos, Tempe, Ariz. 85284

[21] Appl. No.: 704,683

[22] Filed: May 17, 1991

Related U.S. Application Data

[62] Division of Ser. No. 456,424, Dec. 26, 1989, abandoned.

[51] Int. Cl.$^5$ .............................................. H01L 21/265
[52] U.S. Cl. ............................................ 437/31; 437/33; 437/64; 437/909; 148/DIG. 11
[58] Field of Search .......................... 437/31, 33, 63, 64, 437/909, 910, 956; 148/DIG. 39, DIG. 11; 357/36, 38, 43

[56] References Cited

U.S. PATENT DOCUMENTS 4,132,996  1/1979  Baliga ................................. 357/36
4,331,961  5/1982  Baliga ................................. 357/43

Primary Examiner—Brian E. Hearn
Assistant Examiner—Tuan Nguyen

[57] ABSTRACT

A method of internally limiting current and providing overvoltage protection in a semiconductor device comprises providing a semiconductor device having at least a first junction wherein both sides of the junction have predetermined dopant concentrations and wherein the first junction is spaced apart a predetermined distance from either a second junction or current blocking means. The predetermined dopant concentrations and distance are such that when a predetermined voltage is applied to the device, a depletion region from the first junction encounters either a depletion region from the second junction or current blocking means, thereby pinching off current at a desired voltage. The pinch-off voltage may be varied by adjusting the distance between the first junction and either the second junction or current blocking means and also by adjusting the predetermined dopant concentrations.

7 Claims, 2 Drawing Sheets

INTERNAL CURRENT LIMIT AND OVERVOLTAGE PROTECTION METHOD

This application is a division of prior application Ser. No. 07/456,424 filed Dec. 26, 1989 now abandoned.

BACKGROUND OF THE INVENTION

This invention relates, in general, to semiconductor devices, and more particularly to a method of fabricating a semiconductor device having internal current limit and overvoltage protection.

Because of the environments in which they reside and various other factors, many semiconductor devices are subject to overvoltage and large current fluctuations. This is especially true in power discrete devices including those used in integrated circuits. For instance, it is extremely difficult to operate a bipolar power device under maximum power conditions, yet avoid destruction under certain unpredictable voltage and current conditions.

Many methods and structures have been developed to protect semiconductor devices from destruction due to the voltage and current conditions of their environments. However, typical protective structures are external to the intrinsic device. One prior art method of device protection includes the addition of internal or external zener diodes to clamp the emitter-base or collector-emitter junction voltage. When the voltage exceeds the zener voltage, the zener diodes turn on, thereby limiting current. An obvious problem with this method is that the number of zener diodes employed internally depends upon the voltage which the primary transistor is to be turned off. When a high voltage transistor is employed, an excessive number of zener diodes must also be employed. This dissipates power, increases cost, and increases the amount of chip area required.

Another protective method includes the incorporation of emitter ballast resistors to improve the uniformity of current distribution in a device and increase the maximum limit of power dissipation. Although this is somewhat successful, it still requires the addition of external devices which require increased amounts of chip area.

In view of the above, it would be highly desirable to have a method of internally limiting current and providing overvoltage protection in a semiconductor device that employs no additional devices, does not dissipate power, requires no additional chip area, and wherein the pinch-off voltage may be adjusted.

SUMMARY OF THE INVENTION

Accordingly, it is an object of the present invention to provide a method of internally limiting current and providing overvoltage protection in a semiconductor device that requires no additional devices.

Another object of this invention is to provide a method of internally limiting current and providing overvoltage protection in a semiconductor device wherein the pinch-off voltage may be adjusted for a given device.

It is an additional object of the present invention to provide a method of internally limiting current and providing overvoltage protection in a semiconductor device that requires no additional chip area.

Yet a further object of the present invention is to provide a method of internally limiting current and providing overvoltage protection that may be employed in conjunction with high voltage semiconductor devices.

An even further object of the present invention is to provide a method of internally limiting current and providing overvoltage protection that does not dissipate power from a device.

The foregoing and other objects and advantages are achieved in the present invention by one embodiment in which, as a part thereof, includes providing a substrate having semiconductor material of a first conductivity type and predetermined dopant concentration therein. First and second field regions of a second conductivity type and predetermined dopant concentrations are then formed in the semiconductor material so that first and second junctions exist therein, the junctions being spaced apart a predetermined distance. A base region of the first conductivity type and of a predetermined dopant concentration is then formed in the semiconductor material between the first and second field regions followed by the formation of an emitter region of the second conductivity type within the base region. The predetermined dopant concentrations and distance are such that when a predetermined voltage is applied to the device, a depletion region from the first junction encounters a depletion region from the second junction, thereby pinching-off current.

A more complete understanding of the present invention can be attained by considering the following detailed description in conjunction with the accompanying drawings.

DETAILED DESCRIPTION OF THE INVENTION

Figure 1:
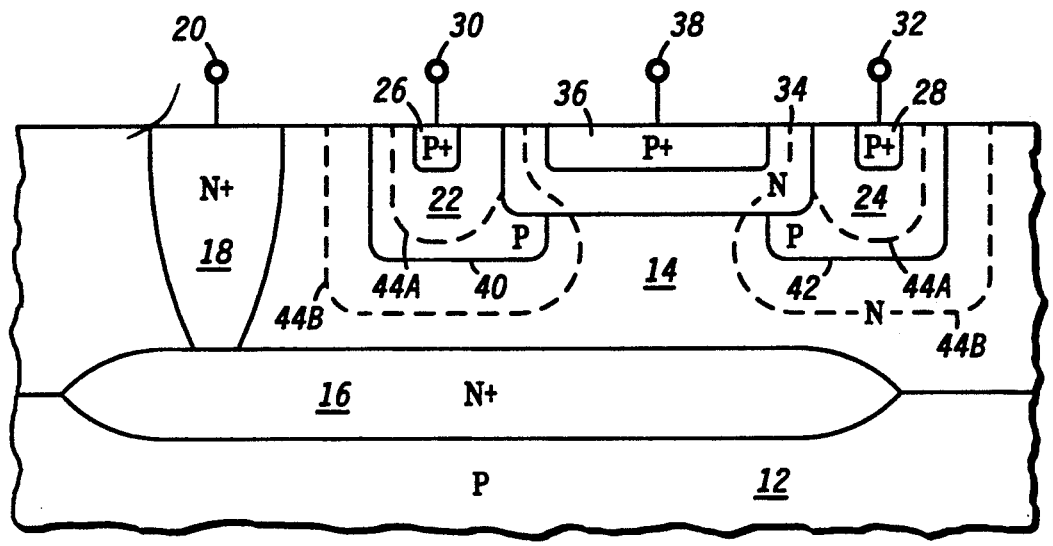
FIGS. 1-4 are highly enlarged cross-sectional views of portions of semiconductor devices illustrating different embodiments of the present invention.

FIGS. 1-4 are highly enlarged cross-sectional views of portions of semiconductor devices embodying the present invention. FIG. 1 illustrates a portion of a lateral bipolar device 10. Although device 10 is a PNP device, it should be understood that the present invention may also be employed in conjunction with an NPN device. Further, although device 10 comprises specific semiconductor materials, one of skill in the art will understand that many other well known semiconductor materials may be employed. Finally, the various distances and dopant concentrations given for device 10 are specifically for a device having a pinch-off voltage of 100 volts. As will be explained presently, the pinch-off voltage for a given device may be varied by adjusting the various dopant concentrations and distances.

Device 10 includes a monosilicon substrate 12, having a P conductivity type. An epitaxial silicon layer 14, having an N conductivity type, is formed thereon. Epitaxial layer 14 has a dopant concentration of approximately $1.5 \times 10^{15}$ cm$^{-3}$. A buried layer 16, having an N+ conductivity type is formed at the interface of substrate 12 and epitaxial layer 14. Buried layer 16 is contacted by N+ region 18, which extends to the surface of epitaxial layer 14 and through which base contact is made at external base contact 20. A first field region 22 and a second field region 24 are formed in epitaxial layer 14. Field regions 22 and 24 both are of a P conductivity type, have a dopant concentration of approximately $5 \times 10^{15}$ cm$^{-3}$ and are approximately 9 microns apart. It should be understood that the dopant concentrations of first and second field regions 22 and 24 may differ although they do not in this embodiment.

First and second P+ collector contact regions 26 and 28, respectively, are formed in first and second field regions 22 and 24. External collector contact is made through first and second collector contact regions 26 and 28 by first and second external collector contacts 30 and 32, respectively. A base region 34 is formed between first and second field regions 22 and 24. As shown, base region 34 extends into field regions 22 and 24 although this is not mandatory. Base region 34 is of an N conductivity type and has a dopant concentration of $2 \times 10^{17}$ cm$^{-3}$. Emitter region 36, of a P+ conductivity type, is formed in base region 34 and emitter contact is made through emitter region 36 to external emitter contact 38.

When device 10 is turned on, first and second junctions 40 and 42, respectively, at the interfaces of first and second field regions 22 and 24 and epitaxial layer 14 result in depletion regions. Depletion regions are formed on each side of the junction and are designated by dotted lines 44 herein. As the voltage applied to device 10 approaches 100 volts, outer depletion regions 44B merge until they finally encounter each other beneath base region 34. When outer depletion regions 44B encounter each other, the base current is prohibited from flowing into base region 34 by outer depletion regions 44B and the current is effectively pinched-off.

The voltage at which current will be pinched-off is dependent upon the various predetermined dopant concentrations and the distance between first and second field regions 22 and 24. It should be understood that if first and second field regions 22 and 24 are further apart, the pinch-off voltage will be higher because a higher voltage will be required for the various junctions to merge. Likewise, higher voltages are required for pinch-off with the use of a higher dopant concentration in epitaxial layer 14 while lower voltages are required for pinch-off with the use of higher dopant concentrations in field regions 22 and 24. It should be understood that by adjusting dopant concentrations and distance between field regions or between a field region and current blocking means as will be discussed presently, the pinch-off voltage for any given device may be varied.

Figure 2:
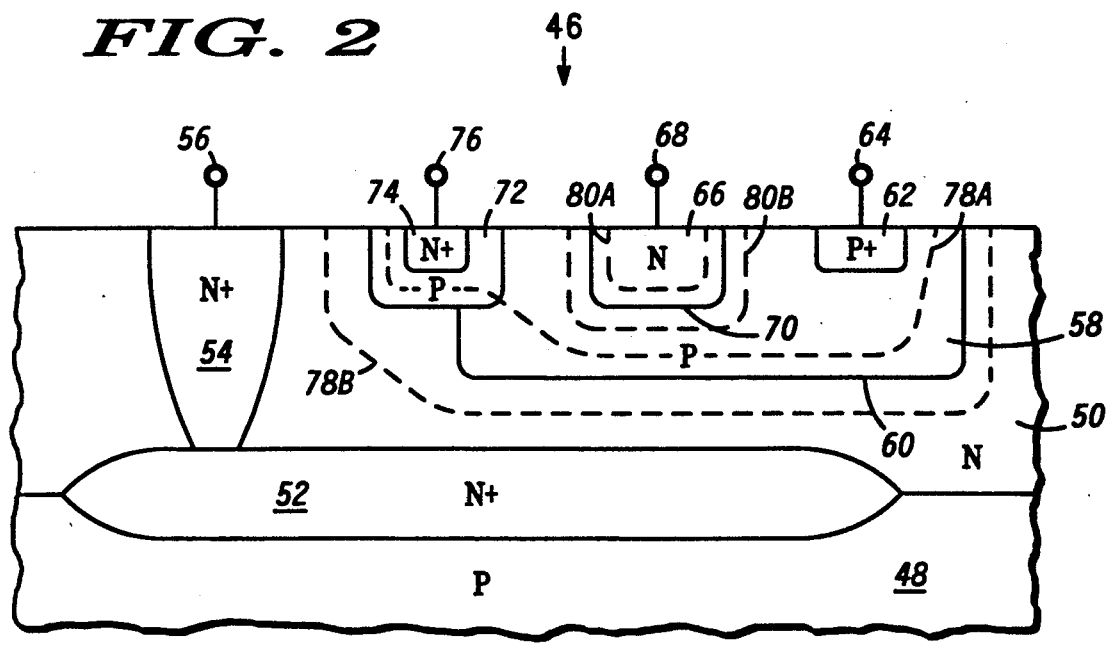

FIG. 2 illustrates an NPN transistor 46, also embodying the present invention. Again, one skilled in the art will understand that although transistor 46 is an NPN transistor, the present invention may also be employed in a similar PNP transistor. Transistor 46 includes substrate 48 of a P conductivity type. An N type epitaxial layer 50 is formed on substrate 48 and a buried layer 52, having an N+ conductivity type, is formed at the interface of substrate 48 and epitaxial layer 50. Buried layer 52 is contiguous with region 54, also of an N+ conductivity type, which allows for external collector contact to be made at external collector contact 56.

A large doped region 58, having a P conductivity type is formed in epitaxial layer 50 and results in a large junction 60. Formed in doped region 58 is P+ type base contact region 62, to which external base contact 64 is coupled. An N doped region 66 is also formed in doped region 58 and is coupled to external contact 68, which will ultimately have the same potential applied to it as does external collector contact 56. The formation of doped region 66 results in a junction 70 at the interface of doped region 66 and doped region 58. A P type intrinsic base region 72 is formed in epitaxial layer 50 and extends into doped region 58 in this embodiment while an emitter region 74, having an N+ conductivity type, is formed in intrinsic base region 72. Emitter region 74 is coupled to external emitter contact 76.

When a potential is applied to transistor 46, depletion regions 80 and 78 form on each side of junction 70 and also on each side of junction 60, respectively. Again, depletion regions are denoted by dotted lines 78 and 80. As the potential applied reaches the predetermined pinch-off voltage, internal depletion region 78A from junction 60 and external depletion region 80B from junction 70 merge and pinch-off the base current. As in the previous embodiment, the controlling parameters to determine the pinch-off voltage are the dopant concentrations and the distance between junction 60 and junction 70.

Figure 3:
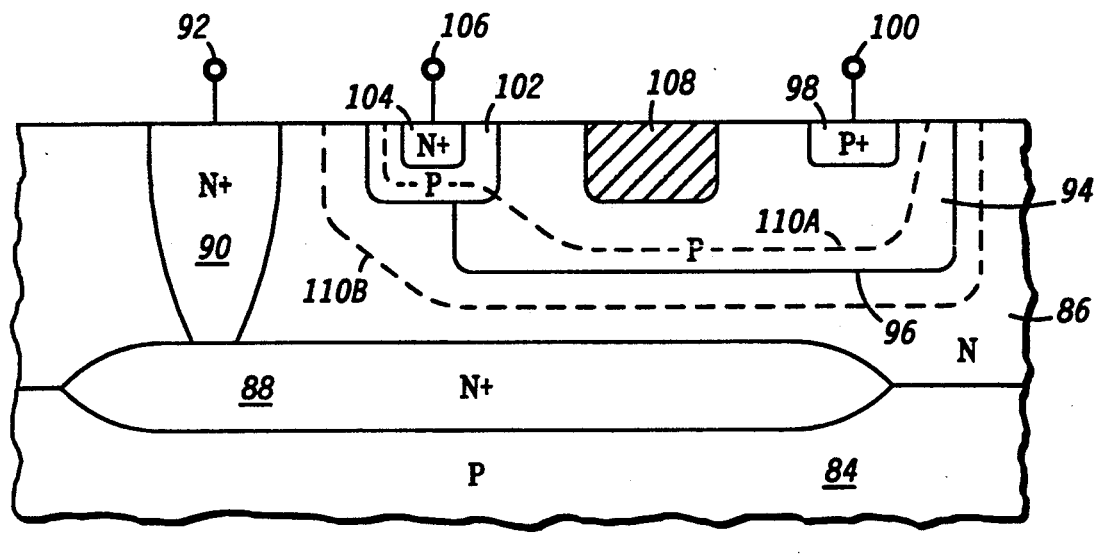

FIG. 3 illustrates a bipolar transistor 82 also embodying the present invention. Bipolar transistor 82 includes a P type substrate 84, an N type epitaxial layer 86 and an N+ buried layer 88 disposed at the interface of substrate 84 and epitaxial layer 86. Buried layer 88 is coupled to N+ region 90 which, in turn, is coupled to external collector contact 92. P doped region 94 is formed in epitaxial layer 86, thereby creating junction 96. A P+ base contact region 98 is formed in doped region 94 and is coupled to external base contact 100. P type intrinsic base region 102 is formed in epitaxial layer 86 and extends into doped region 94 while an N+ emitter region 104 is formed in intrinsic base region 102. Emitter region 104 is coupled to external emitter contact 106. A dielectric region 108, comprising an oxide filled trench in this embodiment, is formed between base contact region 98 and intrinsic base region 102. When a potential is applied to transistor 82, depletion regions 110 form from junction 96 and as the potential reaches the predetermined pinch-off voltage, internal depletion region 110A of junction 96 merges with dielectric region 108 thereby pinching-off the base current.

Figure 4:
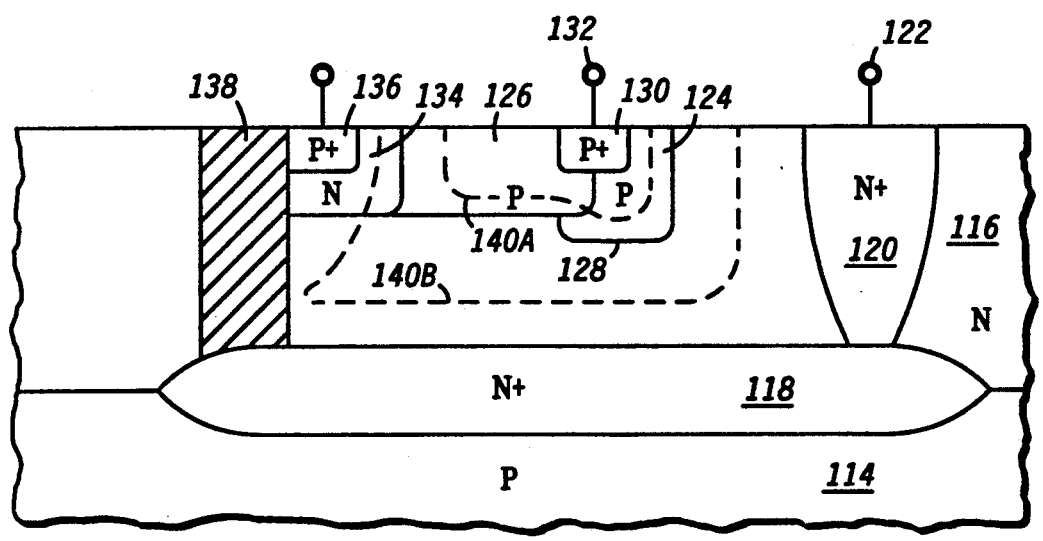

FIG. 4 depicts a transistor 112 further embodying the present invention. Transistor 112 includes a P type substrate on which an N type epitaxial layer 116 has been formed. A N+ buried layer 118 is formed at the interface of substrate and epitaxial layer 116 and is connected to an N+ region 120, which in turn is coupled to an external base contact 122. A P doped well region 124 is formed in epitaxial region 116 and is abutted by a P doped field region 126. The formation of P doped well region 124 and field region 126 in epitaxial region 116 results in junction 128. A P+ collector contact region 130 is formed in well region 124 and field region 126. This, in turn, is coupled to external collector contact 132.

An N type intrinsic base region 134 is formed in epitaxial layer 116 and a P+ emitter region 136 is formed in intrinsic base region 134. In this embodiment base region 134 abuts field region 126. Both intrinsic base region 134 and emitter region 136 abut a dieletric region 138, which is an oxide-filled trench in this embodiment. Although dielectric region 138 extends to buried layer 118 herein, this is not mandatory as long as depletion region 140B encounters dielectric region 138 to pinch-off base current as will be explained presently.

When a potential is applied to transistor 112, depletion regions, again depicted by dotted lines 140, result from junction 128. As the potential reaches the desired pinch-off voltage, external depletion region 140B merges toward dielectric region 138 until they meet at the desired pinch-off voltage, thereby prohibiting the flow of base current. As in the previous embodiments, the controlling parameters are the distance between junction 128 and dielectric region 138, as well as the predetermined dopant concentrations.

Thus it is apparent that there has been provided, in accordance with the invention, a method of internally limiting current and providing overvoltage protection in a semiconductor device, which meets the objects and advantages set forth above. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of internally limiting current and providing overvoltage protection in a bipolar semiconductor device comprising the step of:
   providing a semiconductor device having at least a first junction wherein both sides of said first junction have predetermined dopant concentrations and said first junction is spaced apart a predetermined distance from non-conductive current blocking means, said predetermined dopant concentrations and distance being such that when a predetermined voltage is applied to said device, a depletion region from said first junction encounters said current blocking means thereby pinching-off base current.

2. The method of claim 1 wherein the semiconductor device is a bipolar semiconductor device.

3. The method of claim 2 wherein current blocking means include a dielectric material.

4. The method of claim 2 wherein the predetermined dopant concentrations and the predetermined distance may be varied to change the voltage at which pinch-off occurs.

5. A method of internally limiting current and providing overvoltage protection in a bipolar semiconductor device comprising the steps of:
   providing a substrate including semiconductor material of a first conductivity type and predetermined dopant concentration;
   forming a first field region of a second conductivity type and predetermined dopant concentration in said semiconductor material so that a first junction exists therein;
   forming non-conductive current blocking means in said semiconductor material, said current blocking means being spaced apart a predetermined distance from said first field region;
   forming a base region of said first conductivity type and predetermined dopant concentration in said semiconductor material;
   forming an emitter region of said second conductivity type in said base region; and
   wherein said predetermined dopant concentrations and distance are such that when a predetermined voltage is applied to said device, a depletion region from said first junction encounters said current blocking means thereby pinching-off base current.

6. The method of claim 5 wherein the predetermined dopant concentrations and the predetermined distance may be varied to change the voltage at which pinch-off occurs.

7. The method of claim 6 wherein current blocking means include a dielectric material.

* * * * *